United States Patent
Asai

(10) Patent No.: US 8,064,117 B2
(45) Date of Patent: Nov. 22, 2011

(54) OSCILLATING ELEMENT, MANUFACTURING METHOD OF OSCILLATING ELEMENT, OPTICAL SCANNING DEVICE, IMAGE FORMING DEVICE AND IMAGE DISPLAY DEVICE

(75) Inventor: Nobuaki Asai, Nagoya (JP)

(73) Assignee: Brother Kogyo Kabushiki Kaisha, Nagoya (JP)

(*) Notice: Subject to any disclaimer, the term of this patent is extended or adjusted under 35 U.S.C. 154(b) by 521 days.

(21) Appl. No.: 12/285,111

(22) Filed: Sep. 29, 2008

(65) Prior Publication Data
US 2009/0115918 A1  May 7, 2009

Related U.S. Application Data

(63) Continuation-in-part of application No. PCT/JP2007/055845, filed on Mar. 22, 2007.

(30) Foreign Application Priority Data

Mar. 30, 2006  (JP) .................. 2006-095527

(51) Int. Cl.
G02B 26/08 (2006.01)
(52) U.S. Cl. ............ 359/199.1; 359/213.1; 359/214.1; 359/900; 310/311
(58) Field of Classification Search .... 359/198.1–199.2, 359/200.6–200.8, 213.1–214.1, 223.1–224.2; 310/36, 40 MM, 309, 311
See application file for complete search history.

(56) References Cited

U.S. PATENT DOCUMENTS

| 7,163,874 B2 | 1/2007 | Iwashita et al. |
| 7,320,899 B2 * | 1/2008 | Haluzak et al. .................. 438/31 |
| 7,596,840 B2 | 10/2009 | Iwashita et al. |
| 7,636,993 B2 * | 12/2009 | Okabe et al. .................. 29/25.35 |

FOREIGN PATENT DOCUMENTS

| JP | A 2003-8094 | 1/2003 |
| JP | A 2004-221792 | 8/2004 |
| JP | A-2004-296679 | 10/2004 |
| JP | A 2004-347769 | 12/2004 |
| JP | A-2006-060680 | 3/2006 |

OTHER PUBLICATIONS

Office Action dated Aug. 30, 2011 issued in Japanese Patent Application No. JP-2006-095527 (with translation).

* cited by examiner

Primary Examiner — James Phan
(74) Attorney, Agent, or Firm — Oliff & Berridge, PLC

(57) ABSTRACT

An oscillating element which can improve the adhesiveness thereof with an actuator is disclosed. In an oscillating element which includes a substrate which is configured to support an oscillation portion in an oscillating manner, and a driving layer which is configured to oscillate the oscillation portion, the driving layer including an adhesive layer formed on a substrate side thereof, an intermediate layer is positioned between the substrate and the driving layer. The intermediate layer is made of a material which allows surface activation bonding with the substrate, and the surface roughness of the intermediate layer on the adhesive layer side is set coarser than the surface roughness of the intermediate layer on the substrate side thus allowing the intermediate layer to easily acquire an anchoring effect with the adhesive layer.

22 Claims, 9 Drawing Sheets

US 8,064,117 B2

OSCILLATING ELEMENT, MANUFACTURING METHOD OF OSCILLATING ELEMENT, OPTICAL SCANNING DEVICE, IMAGE FORMING DEVICE AND IMAGE DISPLAY DEVICE

CROSS-REFERENCE TO RELATED APPLICATIONS

The present application is a Continuation-in-Part of International Application No. PCT/JP2007/055845 filed on Mar. 22, 2007, which claims the benefits of Japanese Patent Application No. 2006-095527 filed on Mar. 30, 2006.

BACKGROUND OF THE INVENTION

1. Field of the Invention

The present invention relates to an oscillating element used for scanning by laser beams or the like, for example, and more particularly to an oscillating element oscillated by an actuator such as a piezoelectric element or the like, a manufacturing method of the oscillating element, an optical scanning device which includes such an oscillating element, an image forming device including such an optical scanning device, and an image display device including such an optical scanning device or an image forming device.

2. Description of the Related Art

Conventionally, as the constitution for oscillating a mirror used in performing scanning by laser beams, for example, JP-A-2004-347769 (hereinafter referred to as document 1) discloses the constitution in which a counter electrode is arranged to face a rotary support portion of a mirror formed by making use of a micromachining technique, and the rotary support portion is rotatably oscillated due to an electrostatic force induced by supplying electricity between the electrodes.

Further, as a drive part which rotatably oscillates the rotary support portion of the mirror, as disclosed in patent document 1, an electromagnetic force or a piezoelectric element may be used.

FIG. 6A is a plan view for explaining the oscillating constitution of a mirror using a piezoelectric element. In FIG. 6A, the mirror 100 has both ends thereof rotatably supported on torsional beams 101. An axially end portion of the torsional beam 101 is bifurcated, and the piezoelectric element 102 is mounted on each bifurcated portion.

Due to such a constitution, the torsional beams 101 are rotated in the reciprocating manner by changing over electricity applied to the piezoelectric elements 102 so as to oscillate the mirror 100.

FIG. 6B is a cross-sectional view of an oscillating element 103 when the piezoelectric elements 102 are used as actuators for oscillating a mirror. In FIG. 6B, the oscillating element 103 is configured such that a piezoelectric element 106 is integrally joined to an upper surface of a silicon substrate 104 used as a base.

The piezoelectric element 106 is a device having the three-layered structure, wherein a piezoelectric layer 106A is sandwiched by electrodes 106B. The piezoelectric element 106 is preliminarily formed into a product by cutting out from a bulk or a block and is adhered to a silicon substrate 104 using an adhesive layer 105 which constitutes a portion of the silicon substrate 104.

Such a scanning device is incorporated into a scanning optical system of the above-mentioned optical scanning device or image display device (for example (patent document 1)).

SUMMARY OF THE INVENTION

In forming the actuator for oscillating a mirror by adhering the piezoelectric element 102 to the silicon substrate 104, however, there exists a possibility that the piezoelectric element 102 is easily peeled off from the silicon substrate 104.

That is, the adhesive layer 105 used for adhesion of the piezoelectric element 102 maintains a stable bonded state by an intermolecular force and an anchoring effect which is mechanical bonding induced in an interface between the adhesive layer 105 and a surface to be adhered. However, there may be a case that it is difficult to ensure such a phenomenon depending on properties of a contact surface.

Particularly, a front surface of the silicon substrate 104 is mirror-finished and hence, the anchoring effect acquired by mechanical bonding cannot be expected whereby there may be a case that the bonding is performed only by the intermolecular force. When the sufficient bonding force cannot be acquired between the adhesive layer 105 and the silicon substrate 104 due to such bonding, an adhesion state cannot be maintained due to oscillations applied with time leading to the peeling-off of the piezoelectric element 102 from the silicon substrate 104.

The present invention has been made to overcome such drawbacks of the conventional oscillating element, and it is an object of the present invention to provide an oscillating element which is configured to enhance the adhesiveness with an actuator, a manufacturing method of the oscillating element, and an optical scanning device, an image forming device and an image display device using the oscillating element.

To achieve the above-mentioned object, according to a first aspect of the present invention, there is provided an oscillating element which includes: a substrate which is configured to support an oscillation portion in an oscillating manner; a driving layer which is configured to oscillate the oscillation portion, the driving layer including an adhesive layer formed on a substrate side thereof; and an intermediate layer which is positioned between the substrate and the driving layer, the intermediate layer having one surface thereof bonded to one surface of the substrate and another surface thereof bonded to one surface of the adhesive layer.

To achieve the above-mentioned object, according to a second aspect of the present invention, there is provided an optical scanning device including an oscillating element, wherein the oscillating element comprises: a substrate which is configured to support an oscillation portion in an oscillating manner; a driving layer which is configured to oscillate the oscillation portion, the driving layer including an adhesive layer formed on a substrate side thereof; and an intermediate layer which is positioned between the substrate and the driving layer, the intermediate layer having one surface thereof bonded to one surface of the substrate and another surface thereof bonded to one surface of the adhesive layer, and the optical scanning device is configured to perform scanning by reflecting an optical flux by allowing the oscillation portion to oscillate a reflection surface.

To achieve the above-mentioned object, according to a third aspect of the present invention, there is provided an image forming apparatus including an optical scanning device and capable of forming an image by scanning an optical flux corresponding to a video signal, wherein the optical scanning device includes an oscillating element which comprises: a substrate which is configured to support an oscillation portion in an oscillating manner; a driving layer which is configured to oscillate the oscillation portion, the driving layer including an adhesive layer formed on a substrate side thereof; and an intermediate layer which is positioned between the substrate and the driving layer, the intermediate layer having one surface thereof bonded to one surface of the substrate and another surface thereof bonded to one surface of the adhesive layer.

To achieve the above-mentioned object, according to a fourth aspect of the present invention, there is provided an image display device constituted of an optical-scanning-type image display device, the image display device including an optical scanning device and capable of forming an image by scanning an optical flux corresponding to a video signal and displaying the image by projection, wherein the optical scanning device includes an oscillating element which comprises: a substrate which is configured to support an oscillation portion in an oscillating manner; a driving layer which is configured to oscillate the oscillation portion, the driving layer including an adhesive layer formed on a substrate side thereof; and an intermediate layer which is positioned between the substrate and the driving layer, the intermediate layer having one surface thereof bonded to one surface of the substrate and another surface thereof bonded to one surface of the adhesive layer.

To achieve the above-mentioned object, according to a fifth aspect of the present invention, there is provided a manufacturing method of an oscillating element which includes a substrate which is configured to support an oscillation portion in an oscillating manner, and a driving layer which is configured to oscillate the oscillation portion, the driving layer including an adhesive layer formed on a substrate side thereof, wherein the manufacturing method includes the steps of: forming an intermediate layer such that one surface of the intermediate layer is bonded to one surface of the substrate, and forming the adhesive layer such that one surface of the adhesive layer is bonded to another surface of the intermediate layer thus forming the intermediate layer between the substrate and the driving layer.

BRIEF EXPLANATION OF THE DRAWINGS

FIG. 2A to 2D are views for explaining the constitution of the oscillating element of this embodiment, wherein FIG. 2A is a plan view of the oscillating element, FIG. 2B is a cross-sectional view of the oscillating element as viewed in the direction of an arrow indicated by symbol (B) in FIG. 2A, FIG. 2C is an enlarged cross-sectional side view of a portion of the oscillating element and FIG. 2D is a partially enlarged plan view of the oscillating element;

FIG. 6A and FIG. 6B are views for explaining a conventional example, wherein FIG. 6A is a plan view of the conventional example and FIG. 6B is a cross-sectional view as viewed in the of an arrow indicated by symbol (B) in FIG. 2A.

PREFERRED EMBODIMENTS OF THE PRESENT INVENTION

Preferred embodiments of the present invention are explained in conjunction with drawings hereinafter.

[Constitution of Image Display Device]

Hereinafter, one embodiment of an image display device according to the present invention is explained in conjunction with the drawings. First of all, the constitution of a retinal scanning display 1 forming a retinal scanning image display device (retinal scanning image display device) and constituting one example of the image display device according to the present invention is explained in conjunction with FIG. 1.

Figure 1:
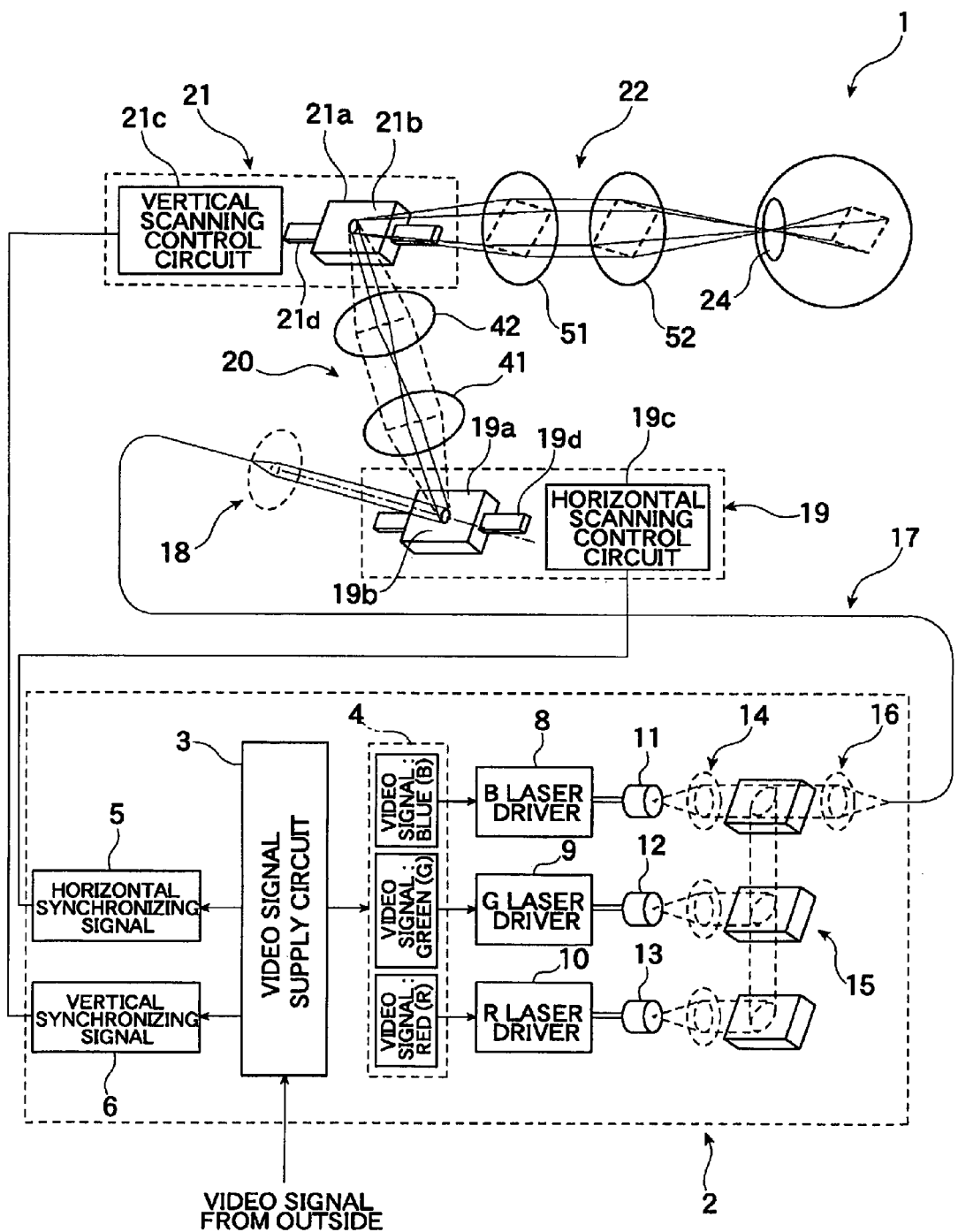
FIG. 1 is a schematic constitutional view showing a retinal scanning image display device as an image display device of this embodiment.

As shown in FIG. 1, the retinal scanning display 1 includes a light source unit part 2. The light source unit part 2 include a video signal supply circuit 3 which generates, upon reception of inputting of a video signal from the outside, respective signals which become elements to be used for synthesizing an image in response to the video signal. A video signal 4, a horizontal synchronizing signal 5 and a vertical synchronizing signal 6 are outputted from the video signal supply circuit 3.

The light source unit part 2 also includes an R laser driver 10, a G laser driver 9 and a B laser driver 8. These laser drivers 10, 9, 8 are provided for driving an R laser 13, a G laser 12 and a B laser 11 which constitute a light source such that these lasers 13, 12, 11 radiate laser beams whose intensities are respectively modulated in response to the respective video signals of red (R), green (G) and blue (B) transmitted from the video signal supply circuit 3 as video signals 4.

Further, the light source unit part 2 includes collimation optical systems 14 for collimating laser beams radiated from the respective lasers, dichroic mirrors 15 for optically multiplexing laser beams which are respectively collimated and a fiber coupling optical system 16 for guiding the multiplexed laser beams into an optical fiber 17. Here, when each light source is formed of a semiconductor laser, the light source can directly perform the intensity modulation, while when each light source is formed of a solid laser, the light source unit part 2 includes an intensity modulator which makes use of an acousto-optic effect.

Here, the R laser 13, the G laser 12 and the B laser 11 may be formed of a semiconductor laser such as a laser diode or a solid laser. Further, the light source unit part 2 of this embodiment exemplifies one example of a modulation means which modulates intensity of an optical flux radiated from the R laser 13, the G laser 12 and the B laser 11 which constitutes the light source in response to the video signal.

Further, the retinal scanning display 1 also includes an optical system 18 for receiving the laser beams transmitted and radiated from the light source unit part 2, the horizontal scanning system 19 which constitutes a first scanning system for scanning the guided laser beams by the optical system 18 in the horizontal direction by making use of a Galvano mirror 19a, a first relay optical system 20 for guiding the laser beams scanned by the horizontal scanning system 19 to a vertical scanning system 21 which constitutes a second scanning system, the vertical scanning system 21 for scanning the laser beams which are scanned by the horizontal scanning system 19 and are incident thereon by way of the first relay optical system 20 in the vertical direction by making use of a Galvano mirror 21a, and a second relay optical system 22 for allowing the laser beams scanned by the vertical scanning system 21 to be incident on a pupil 24 of a viewer.

The first relay optical system 20 includes convex-surface lenses 41, 42, and the second relay optical system 22 includes convex-surface lenses 51, 52. The convex-surface lens 41 and the convex-surface lens 42 have optical powers which are equal to each other. The convex-surface lens 51 and the convex-surface lens 52 have optical powers which are equal to each other.

The first relay optical system 20 is provided for conjugating the Galvano mirror 19*a* of the horizontal scanning system 19 and the Galvano mirror 21*a* of the vertical scanning system 21, and the second relay optical system 22 is provided for conjugating the Galvano mirror 21*a* and the pupil 24 of the viewer respectively.

The horizontal scanning system 19 is an optical system which performs horizontal scanning (one example of primary scanning) for scanning the laser beams in the horizontal direction for each frame of an image to be displayed. Further, the horizontal scanning system 19 includes the Galvano mirror 19*a* for scanning the laser beams in the horizontal direction and a horizontal scanning control circuit 19*c* which performs a driving control of the Galvano mirror 19*a*.

On the other hand, the vertical scanning system 21 is an optical system which performs a vertical scanning (one example of secondary scanning) for scanning the laser beams scanned in the horizontal direction by the horizontal scanning system 19 in the vertical direction. Further, the vertical scanning system 21 includes the Galvano mirror 21*a* for scanning the laser beams in the vertical direction and a vertical scanning control circuit 21*c* which performs a driving control of the Galvano mirror 21*a*.

Accordingly, the horizontal scanning system 19 and the vertical scanning system 21 are configured to perform scanning in the directions which intersect with each other.

Further, the horizontal scanning system 19, the vertical scanning system 21 are configured such that the horizontal scanning system 19 and the vertical scanning system 21 are respectively connected to the video signal supply circuit 3 and scan the laser beam respectively in synchronism with the horizontal synchronizing signal 5 and the vertical synchronizing signal 6 outputted from the video signal supply circuit 3.

The horizontal scanning system 19, the vertical scanning system 21 and the like according to this embodiment are exemplified as one example of the optical scanning device which scans the incident optical flux in the primary direction as well as in the secondary direction approximately perpendicular to the primary direction.

Next, operational steps that the retinal scanning display 1 of one embodiment according to the present invention takes upon reception of the video signal from the outside to the projection of the image on the retina of the viewer are explained in conjunction with FIG. 1.

As shown in FIG. 1, in the retinal scanning display 1 of this embodiment, when the video signal supply circuit 3 formed in the light source unit part 2 receives the video signal supplied from the outside, the video signal supply circuit 3 outputs the video signal 4 constituted of an R video signal, a G video signal and a B video signal for controlling outputting laser beams of respective colors of red, green, blue, the horizontal synchronizing signal 5 and the vertical synchronizing signal 6. In response to the respective inputted R video signal, G video signal and B video signal, the R laser driver 10, the G laser driver 9 and the B laser driver 8 output respective driving signals to the R laser 13, the G laser 12 and the B laser 11. In response to these driving signals, the R laser 13, the G laser 12 and the B laser 11 respectively generate the laser beams whose intensities are modulated and output the respective laser beams to the collimation optical systems 14. Further, the video signal supply circuit 3 generates the laser beams in response to a BD signal (not shown in the drawing) indicative of a driving state of the Galvano mirror 19*a* described later and controls timing for outputting the respective laser beams to the collimation optical systems 14. That is, such a retinal scanning display 1 (video signal supply circuit 3) controls timing at which the optical flux is radiated to the Galvano mirror 19*a* or the like. The generated laser beams are respectively collimated into parallel lights by the collimation optical systems 14. Further, the generated laser beams are incident on the dichroic mirror 15 to be optically multiplexed into one optical flux and, thereafter, the optical flux is guided to be incident on the optical fiber 17 by the fiber coupling optical system 16.

The laser beams transmitted through the optical fiber 17 are guided from the optical fiber 17 by the optical system 18 and are radiated to the horizontal scanning system 19. The radiated laser beams are incident on a deflection surface 19*b* which constitutes a reflection surface of the Galvano mirror 19*a* in the horizontal scanning system 19. The laser beams which are incident on the deflection surface 19*b* of the Galvano mirror 19*a* are scanned in the horizontal direction in synchronism with the horizontal synchronizing signal 5 and, via the first relay optical system 20, are incident on the deflection surface 21*b* which constitutes a reflection surface of the Galvano mirror 21*a* in the vertical scanning system 21. In the first relay optical system 20, the deflection surface 19*b* of the Galvano mirror 19*a* and the deflection surface 21*b* of the Galvano mirror 21*a* are adjusted to assume a conjugative relationship. The Galvano mirror 21*a* has the deflection surface 21*b* thereof reciprocally oscillated in synchronism with the vertical synchronizing signal 6 in the same manner that the Galvano mirror 19*a* is synchronized with the horizontal synchronizing signal 5 to allow the radiation of angle of the incident light in the horizontal direction to be changed. Accordingly, the laser beams are scanned in the vertical direction using the Galvano mirror 21*a*. The laser beams which are scanned in the horizontal direction and the vertical direction, that is, two-dimensionally, by the horizontal scanning system 19 and the vertical scanning system 21 are incident on the pupil 24 of the viewer using the second relay optical system 22 configured to make the deflection surface 21*b* of the Galvano mirror 21*a* and the pupil 24 of the viewer assume a conjugative relationship and, then, the laser beams are projected on the retina. The viewer can recognize an image formed by the laser beams which are two-dimensionally scanned and are projected on the retina in this manner. The Galvano mirror 19*a* in the horizontal scanning system 19 and the Galvano mirror 21*a* in the vertical scanning system 21 have been explained using the same name, that is, Galvano mirror. However, any Galvano mirror can be used provided that an angle of a reflection surface (deflection surface) can be changed (oscillated, rotated or the like) for scanning light. This embodiment adopts the constitution (the detail thereof being explained later) in which a piezoelectric driving method which uses a piezoelectric layer as a driving layer is adopted for defining the oscillation angles (oscillation angles) of the Galvano mirrors 19*a*, 21*a*. However, the driving method which induces the change of angle (oscillation, rotation or the like) for scanning using the Galvano mirror 19*a*, 21*a* is not limited to such constitution, and the driving method may include a resonance-type driving method, a non-resonance-type driving method, an electromagnetic driving method, an electrostatic driving method and the like.

The retinal scanning display 1 is a head-mounting-type image display device also referred to as a head mounting display mountable on the viewer's head. The retinal scanning display 1 is mounted on a housing not shown in the drawing having a shape of glasses, a goggle shape, a helmet shape or the like, for example, and is mounted on a viewer's head.

[Constitution of Various Optical Systems]

The constitution of various optical systems which guide the beams radiated from the optical fiber 17 to the pupil 24 of the viewer while performing of scanning of the beams two-dimensionally as described above is explained.

The Galvano mirror 19a is rotatably driven about an axis extending in the vertical direction and hence, the beams incident from the optical system 18 are reflected on the deflection surface 19b for performing scanning of the beams in the horizontal direction and are radiated and guided to the first relay optical system 20.

The Galvano mirror 21a is rotatably driven about an axis extending in the horizontal direction and hence, the beams which are incident from the first relay optical system are reflected on the deflection surface 21b for performing scanning of the beams in the vertical direction and radiated and are guided to the second relay optical system 22.

Next, the driving structure of the Galvano mirrors 19a, 21a of this embodiment is explained. In this embodiment, the horizontal scanning system 19 and the vertical scanning system 21 respectively constitute the optical scanning device which includes the Galvano mirrors 19a, 21a. Here, the retinal scanning display 1 includes an image forming device which forms an image by scanning beams corresponding to the video signals two-dimensionally using the optical scanning device and projects the image on a retina of an eye to display the image.

The Galvano mirrors 19a, 21a used in this embodiment are used integrally with an oscillating element to which a micro-machining technique is applied.

FIG. 2 shows the constitution of the oscillating element for oscillating the Galvano mirrors 19a, 21a shown in FIG. 1. Here, in the following explanation, for facilitating the understanding of the oscillating element, the explanation is made with respect to the Galvano mirror indicated by symbol 19a in FIG. 1 as an object. However, it must be noted as a matter of course that the Galvano mirror indicated by symbol 21a has the same constitution.

Figure 2A:
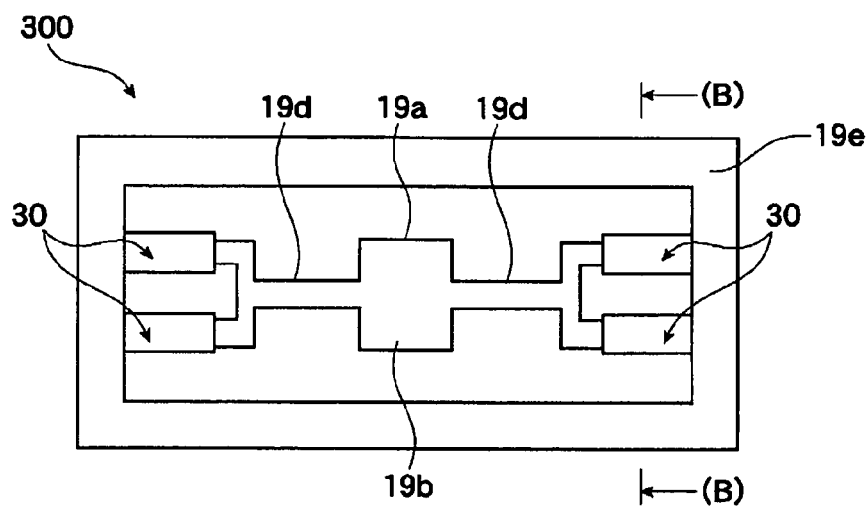
Figure 2B:
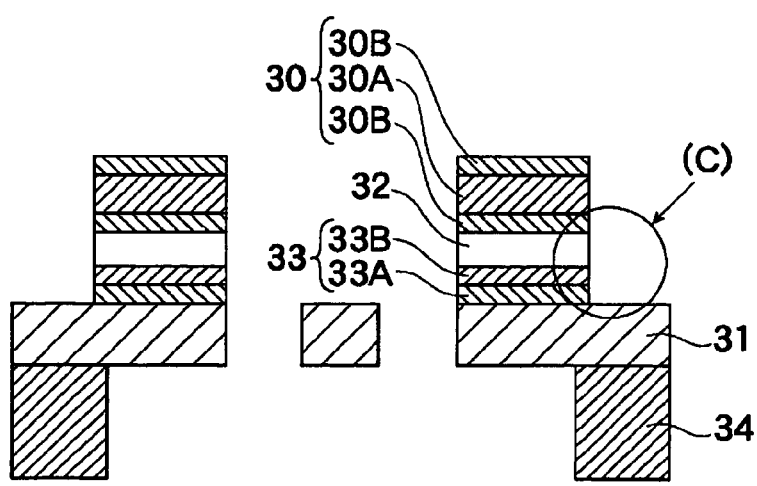
Figure 2C:
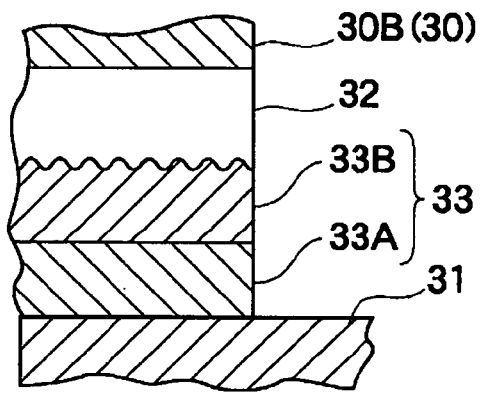
Figure 2D:
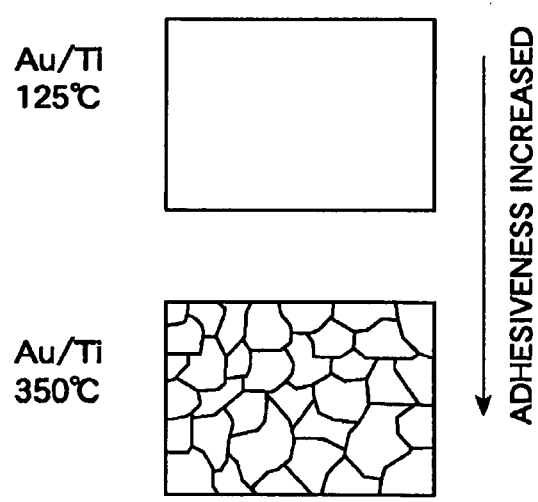

FIG. 2A shows a deflection surface 19b side of the oscillating element 300. FIG. 2B is a schematic cross-sectional view of the oscillating element 300 as viewed in the direction indicated by an arrow (B) in FIG. 2A. FIG. 2C is an enlarged view of a portion of the oscillating element 300 in FIG. 2B, and FIG. 2D is an enlarged plan view of the intermediate layer 33 shown in FIG. 2C.

Figure 6A:
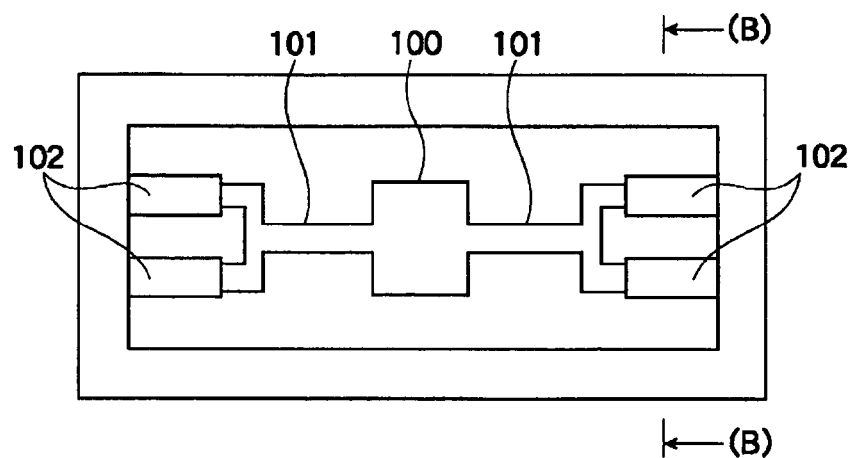
Figure 6B:
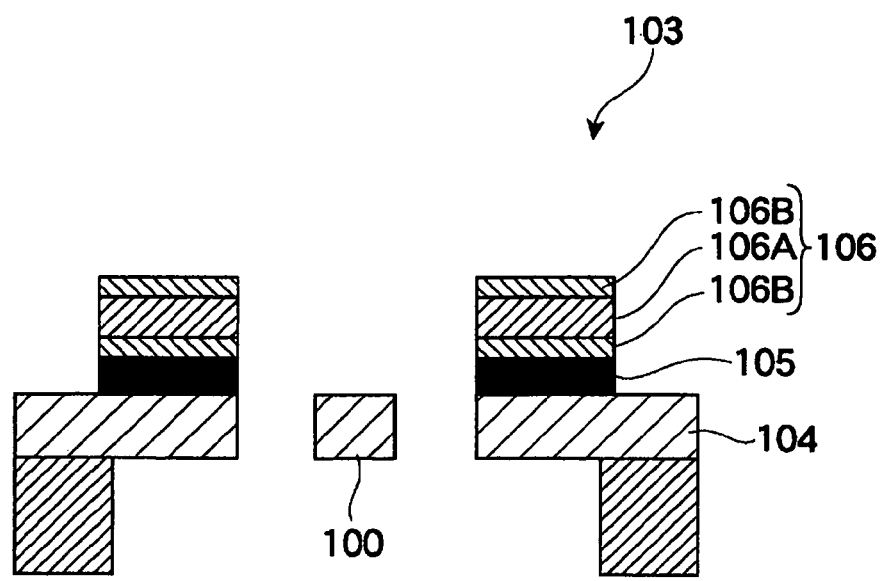

The oscillating element 300 includes, in the same manner as the constitution shown in FIG. 6, the Galvano mirror 19a which constitutes an oscillation portion in a center portion thereof and a silicon substrate 31 which enables the Galvano mirror 19a to be oscillated thereon. Both ends of the Galvano mirror 19a are formed integrally with torsional beams 19d and are rotatably supported about the torsional beams 19d and hence, the Galvano mirror 19a can be oscillated.

A longitudinal end portion of the torsional beam 19d is bifurcated. On surfaces of the bifurcated portions on the same side as the deflection surface 19b, a piezoelectric element 30 which constitutes an actuator used as a driving layer of the oscillating element 300 is mounted. The detailed explanation is made hereinafter in conjunction with FIG. 2B.

The piezoelectric element 30 is adhered to the silicon substrate 31 having a pedestal 34 by way of an adhesive layer 32. However, in this embodiment, an intermediate layer 33 is formed between the silicon substrate 31 and the adhesive layer 32.

The intermediate layer 33 has one surface thereof bonded to one surface of the silicon substrate 31 and another surface thereof bonded to the adhesive layer 32. The intermediate layer 33 is formed of a metal film having the two-layered structure constituted of a plurality of different metal layers 33A, 33B which are brought into contact with and are bonded to the silicon substrate 31 and the adhesive layer 32 respectively.

The intermediate layer 33 is, as shown in FIG. 2C, formed by stacking the metal layer 33A and the metal layer 33B using a vapor deposition method, wherein the metal layer 33A made of titanium (Ti) is formed on a side of the intermediate layer 33 bonded to one surface of the silicon substrate 31 and the metal layer 33B made of gold (Au) is formed on a side of the intermediate layer 33 bonded to the adhesive layer 32.

As criteria in selecting materials used for forming the metal layers, the following conditions are set. The material of the metal layer 33A positioned on the silicon substrate 31 side is required to possess a function of strengthening an interatomic chemical bonding force by accelerating the crystallization on a surface of the material due to activation of the surface by heating. The material of the metal layer 33B positioned on the adhesive layer 32 side is required to possess a function of facilitating the bonding by an anchoring effect due to a fact that the surface roughness of the metal layer 33B is apt to become coarser than the surface roughness of the metal layer 33A positioned on the silicon substrate 31 side by heating.

With respect to the metal layers having the above-mentioned constitution, by making the surface of the metal layer 33B positioned on the adhesive layer side 32 coarse, bonding acquired by the anchoring effect which is mechanical bonding is performed in addition to the intermolecular force and hence, different from a case in which the adhesive layer 32 is brought into direct contact with the silicon substrate 31, an adhesion strength can be increased.

As a result of such adhesion, a strength which prevents peeling-off of the adhesive layer 32 from the silicon substrate 31 can be enhanced.

However, with respect to the material for forming the metal layer 33A on the side bonded to the silicon substrate 31, it is important to exclude a material which merely reacts with silicon which is a material of the substrate and hardly influences the enhancement of the bonding strength. For example, copper or the like is considered as such a material.

The bonding between the metal layers is acquired by intermolecular bonding by heating.

As the combination of materials used for forming the metal layers 33A, 33B constituting the intermediate layer 33, in addition to the above-mentioned combination of Au/Ti (right-side material forming the metal layer positioned on the silicon substrate 31 side), the combination of Au/Cr, Pt/Ti, Pt/Cr, Pt/IrO$_2$, Pt/Ta or the like can be named.

On the other hand, the piezoelectric element 30 bonded to the silicon substrate 31 by way of the adhesive layer 32 is formed of a piezoelectric element which arranges electrode layers 30B on both sides of the piezoelectric layer 30A which constitutes a drive layer such that the piezoelectric layer 30A is sandwiched by the electrode layers 30B.

Here, the adhesive layer 32 used for adhering the piezoelectric element 30 may be made of not only an insulation material used in the constitution shown in FIG. 2 in which a pair of electrodes is used as the piezoelectric element but also a conductive material. When the conductive material is used for forming the adhesive layer 32, the adhesive layer 32 may also function as one electrode of the piezoelectric element 30. When the conductive material is used for forming the adhesive layer 32 in this manner, it is possible to decrease a thickness of the piezoelectric element 30 and hence, the actuator can be miniaturized.

As such an insulating or conductive adhesive material, an adhesive agent made of epoxy resin is used.

The piezoelectric element 30 can, although not shown in the drawing, rotate and oscillate the torsional beam 19d by generating an electrostriction phenomenon corresponding to a power supply level selected at a power supply terminal connected to the electrode.

Figure 3:
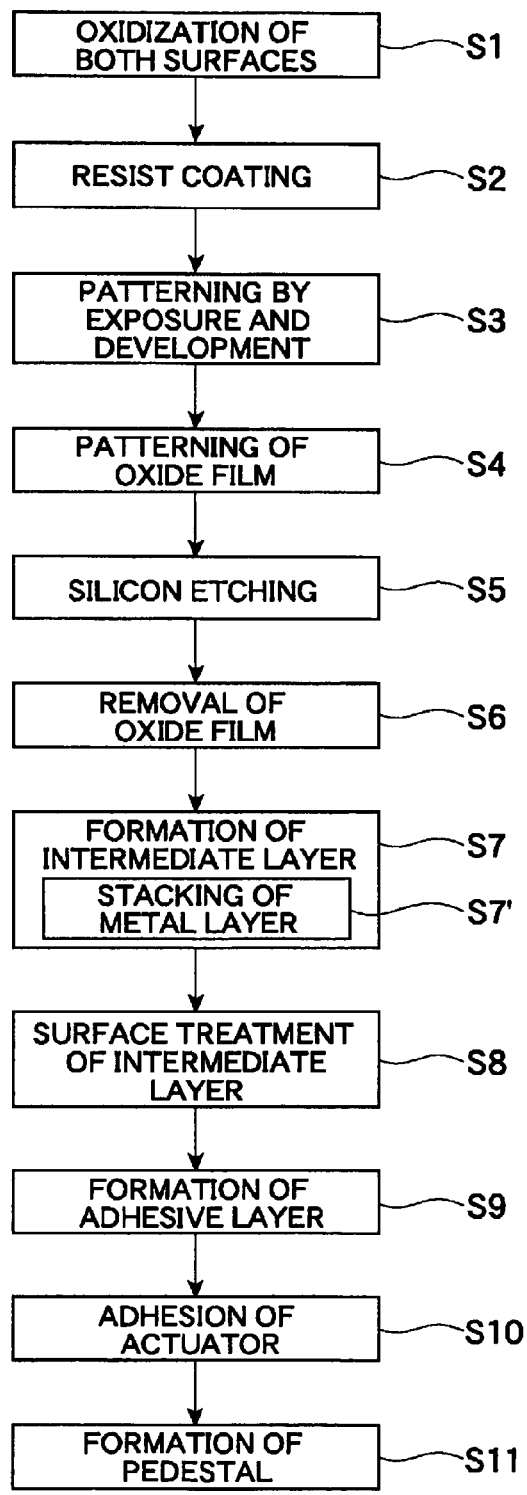
FIG. 3 is a flowchart for explaining steps of preparing the oscillating element of this embodiment.

The oscillating element 300 used in this embodiment is manufactured in accordance with steps shown in FIG. 3. Further, FIG. 4 is a schematic view of the actuator showing the processing through which steps shown in FIG. 3 are executed. Here, the processing shown in FIG. 4 is performed on a premise that the insulation layer is used for forming the adhesive layer 32.

In FIG. 3 and FIG. 4, to form the silicon substrate 31 which constitutes a base of the actuator, in the same manner as existing semiconductor forming processing, the formation of an oxide film 31a (FIG. 3 S1, FIG. 4A), the application of a resist 35 (FIG. 3 S2), the patterning by exposure and development processing (FIG. 3 S3, FIG. 4B), the patterning of the oxide film (FIG. 3 S4, FIG. 4C), the removal of the resist 35 (FIG. 4D), the silicon etching (FIG. 3 S5, FIG. 4E), and the removal of the oxide film (FIG. 3 S6, FIG. 4F) are performed. In this manner, portions corresponding to the Galvano mirrors 19a which are necessary for forming the actuators, the torsional beam 19d and the like are formed by etching.

Figure 4A:
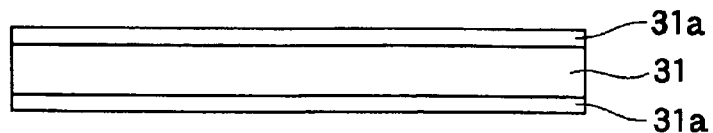
FIG. 4 is a view for explaining steps of forming the oscillating element of this embodiment in accordance with steps for preparing the oscillating element shown in FIG. 3.
Figure 4B:
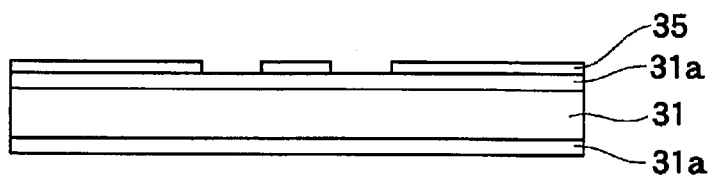
Figure 4C:
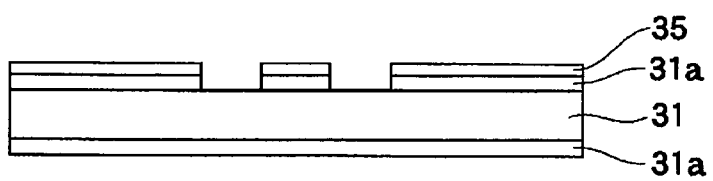
Figure 4D:
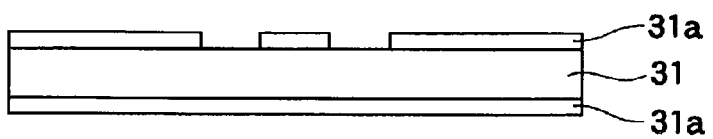
Figure 4E:
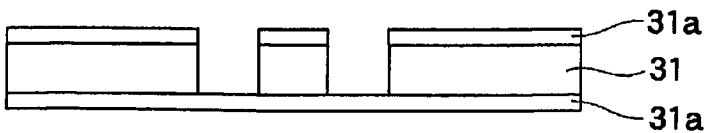
Figure 4F:
Figure 4G:
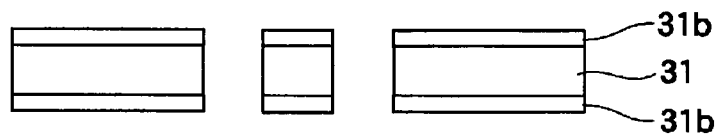
Figure 4H:
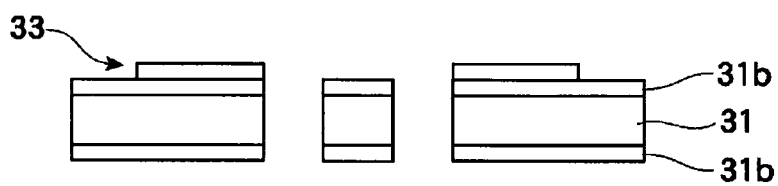

Next, in forming the intermediate layer 33, the oxide film 31b is formed as a base layer (FIG. 4G), and the intermediate layer 33 is formed on the oxide film 31b (FIG. 3 S7, FIG. 4H). In this manner, the silicon substrate 31 is covered with the oxide film 31b in the same manner as a silicon substrate used in general and hence, the adhesive strength between the silicon substrate 31 and the actuator is ensured without pushing up a cost.

Next, with respect to the intermediate layer forming step which forms such an intermediate layer 33, since the intermediate layer 33 is constituted of the plurality of metal layers 33A, 33B in this embodiment, the metal layers (metal films) are stacked using a vacuum evaporation method, a sputtering method, a sol-gel method or a patterning method such as screen printing to form the intermediate layer 33. The intermediate layer forming step includes a metal layer stacking step (FIG. 3 S7') for stacking the metal layers 33A, 33B.

When the intermediate layer 33 is formed by the above-mentioned method, heat treatment is applied to the intermediate layer 33 as the intermediate layer surface processing step (FIG. 3 S8) to allow the intermediate layer 33 to acquire surface property which can enhance the bonding strength. That is, when the intermediate layer 33 made of Au/Ti is formed, for example, heat treatment is performed at a temperature which falls within a range from 125° C. to 350° C.

FIG. 2D shows the relationship between the heating temperature and the adhesive property of the bonding surface. As can be understood from FIG. 2D, when the heating temperature is high, the crystallization is accelerated and hence, the roughness of the surface becomes coarser whereby the above-described surface property can be acquired more easily leading to the enhancement of the adhesive property.

However, to consider the condition of the degree of roughness which is suitable for forming the film, it is necessary to obviate excessive heating. The optimum temperature differs depending on a type of metal. When the metal layers are made of the combination of Au/Ti, the optimum temperature is 350° C., while when the metal layers are made of the combination of Pt/Ti, the optimum temperature is 600° C.

By making the surface of the metal layer 33B which is brought into contact with the adhesive layer 32 coarser than the surface of the metal layer 33A positioned on the silicon substrate 31 side and the surface of the silicon substrate 31, the bonding acquired by an anchoring effect can be enhanced.

Figure 4I:
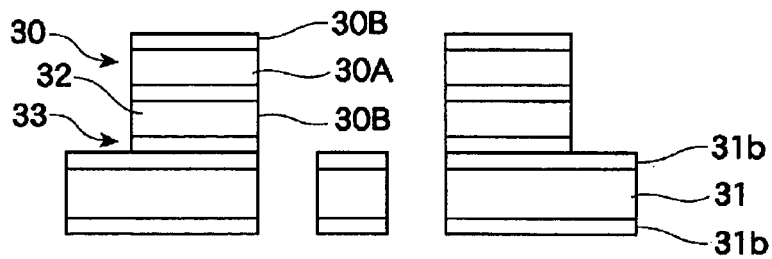
Figure 4J:
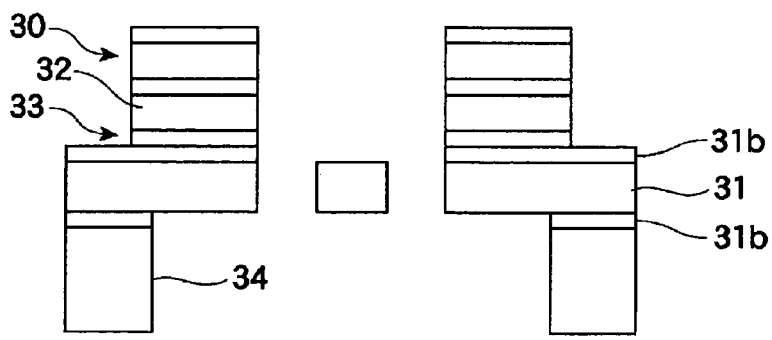
Figure 5A:
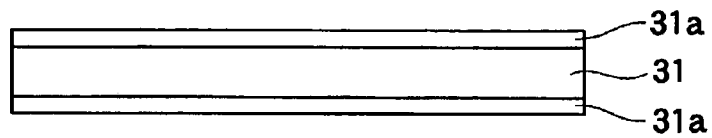
FIG. 5 is a view for explaining a modification which partially modifies the steps of forming the oscillating element shown in FIG. 4.
Figure 5B:
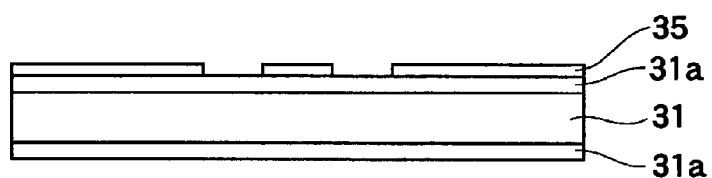
Figure 5C:
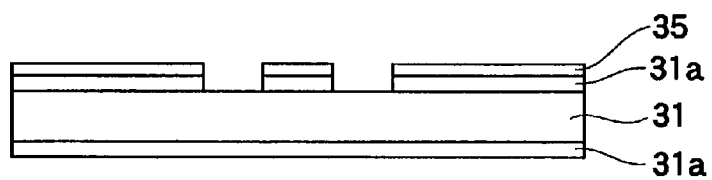
Figure 5D:
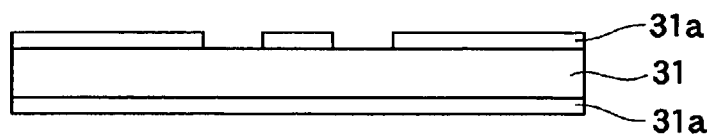
Figure 5E:
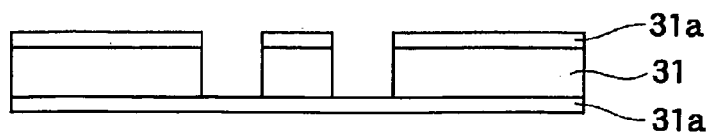
Figure 5F:
Figure 5G:
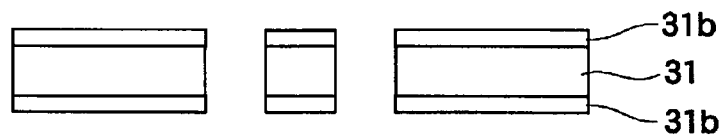
Figure 5H:
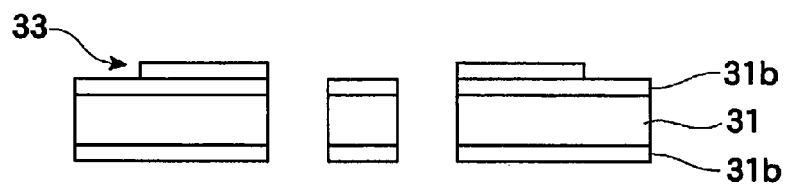
Figure 5I:
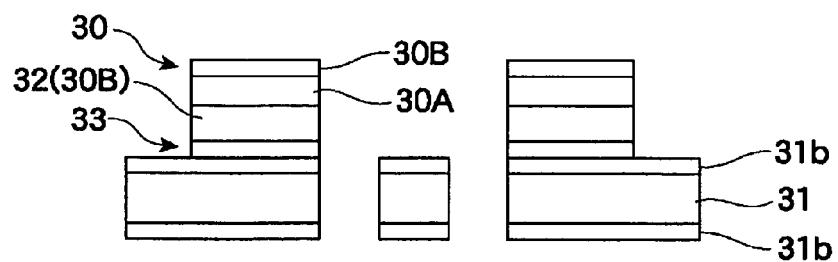
Figure 5J:
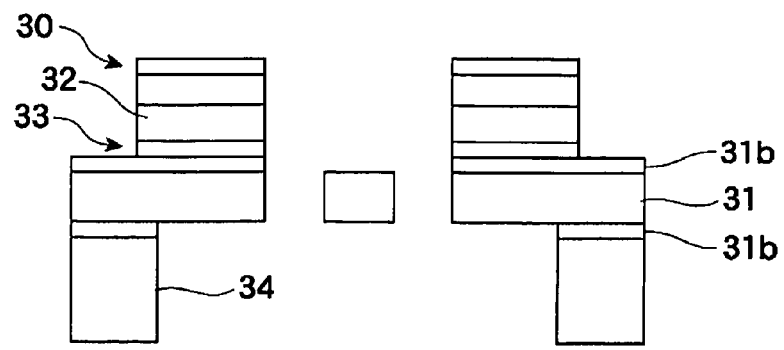

The adhesive layer 32 is formed on the intermediate layer 33 formed in the above-mentioned manner (FIG. 3 S9) (adhesive layer forming step) and, thereafter, a piezoelectric element forming step which bonds the preliminarily formed piezoelectric element 30 to the silicon substrate 31 side by way of the adhesive layer 32 is performed (FIG. 3 S10, FIG. 4I). Then, the base 34 is adhered to the silicon substrate 31 thus constituting the actuator (FIG. 3 S11, FIG. 4J).

On the other hand, FIG. 5 shows the processing when the adhesive layer 32 is made of a conductive material. The processing of this case differs from the processing shown in FIG. 4 with respect to a point that, subsequent to the formation of the intermediate layer shown in FIG. 4H, in the piezoelectric element forming step, as shown in FIG. 5I, the piezoelectric layer 30A is directly bonded to the adhesive layer 32 which is bonded to the metal layer 33B. Since the adhesive layer 32 is a conductive layer, one electrode of the piezoelectric element 30 can be omitted and hence, the reduction of layer thickness of the piezoelectric element 30 and the reduction of a manufacturing cost of the piezoelectric element 30 can be realized.

Here, as has been described heretofore, the preferred embodiments of the present invention are explained in detail. However, the present invention is not limited to the specific embodiments, and various modifications and variations can be made within a scope of the present invention described in claims.

For example, in the above-mentioned embodiments, the beams are firstly scanned in the horizontal direction by the horizontal scanning system 19 and, thereafter, are scanned in the vertical direction by the vertical scanning system 21. However, the present invention is not limited to such constitution, and the optical element may be configured such that the beams are firstly scanned in the vertical direction by the vertical scanning system and, thereafter, are scanned in the horizontal direction by the horizontal scanning system.

Further, in the above-mentioned embodiment, the explanation is made with respect to the retinal scanning display (one example of retinal scanning image display device) which includes the oscillating elements, the optical scanning devices described above, and the image forming device which forms an image by scanning the optical flux modulated in response to the video signal in the primary direction as well as in the secondary direction using the oscillating elements, and forms an image and projects the image on the retina of the eye to display the image. However, the present invention is not limited to such an embodiment. For example, instead of directly projecting the image on the retina of the eye, the present invention may be applicable to an optical scanning image display device, a display or the like (one example of the image display device) which includes the oscillating element, the optical scanning device as described above, and an image forming device which forms an image by scanning the optical flux modulated in response to the video signal in the primary direction as well as in the secondary direction using the oscillating elements, and forms an image and projects and displays such an image on a screen or the like.

Further, the oscillating element and the optical scanning device which adopt the present invention are applicable to an oscillating element, or an optical scanning device which scans laser beams in the inside of an image forming device such as a laser printer.

The advantageous effects of the embodiments of the present invention are merely enumeration of most preferable advantageous effects acquired by the present invention and the advantageous effects acquired by the present invention is not limited to the advantageous effects described in the embodiments of the present invention.

What is claimed is:

1. An oscillating element comprising:
   a substrate which is configured to support an oscillation portion in an oscillating manner;
   a driving layer which is configured to oscillate the oscillation portion, the driving layer including an adhesive layer formed on a substrate side thereof; and
   an intermediate layer which is positioned between the substrate and the driving layer, the intermediate layer having one surface thereof bonded to one surface of the substrate and another surface thereof bonded to one surface of the adhesive layer.

2. An oscillating element according to claim 1, wherein the driving layer includes a piezoelectric layer positioned on another surface of the adhesive layer, and an electrode layer positioned between the piezoelectric layer and the adhesive layer and being configured to drive the piezoelectric layer.

3. An oscillating element according to claim 1, wherein the adhesive layer possesses conductivity, and the driving layer includes a piezoelectric layer arranged adjacent to the adhesive layer.

4. An oscillating element according to claim 1, wherein the surface roughness of another surface of the intermediate layer is coarser than the surface roughness of one surface of the substrate.

5. An oscillating element according to claim 1, wherein the intermediate layer includes a metal film.

6. An oscillating element according to claim 5, wherein the metal film is constituted of plural kinds of metal layers different from each other.

7. An oscillating element according to claim 6, wherein the combination of the metal layer of the intermediate layer forming an adhesion-layer-side surface and the metal layer of the intermediate layer forming a substrate-side surface is one selected from a group consisting of Au/Ti, Pt/Ti, Au/Cr, Pt/Cr, Pt/IrO$_2$, Pt/W and Pt/Ta.

8. An oscillating element according to claim 5, wherein the metal film is subject to heat treatment after film forming.

9. An oscillating element according to claim 1, wherein the intermediate layer is formed by a film forming method selected from a group consisting of a vapor deposition method, a sputtering method, a sol-gel method, and a screen printing method.

10. An oscillating element according to claim 1, wherein a surface of the substrate is covered with an oxide film.

11. An optical scanning device including an oscillating element, wherein
    the oscillating element comprises:
    a substrate which is configured to support an oscillation portion in an oscillating manner;
    a driving layer which is configured to oscillate the oscillation portion, the driving layer including an adhesive layer formed on a substrate side thereof; and
    an intermediate layer which is positioned between the substrate and the driving layer, the intermediate layer having one surface thereof bonded to one surface of the substrate and another surface thereof bonded to one surface of the adhesive layer, and
    the optical scanning device is configured to perform scanning by reflecting an optical flux by allowing the oscillation portion to oscillate a reflection surface.

12. An image forming apparatus including an optical scanning device and capable of forming an image by scanning an optical flux corresponding to a video signal, wherein
    the optical scanning device includes an oscillating element which comprises:
    a substrate which is configured to support an oscillation portion in an oscillating manner;
    a driving layer which is configured to oscillate the oscillation portion, the driving layer including an adhesive layer formed on a substrate side thereof; and
    an intermediate layer which is positioned between the substrate and the driving layer, the intermediate layer having one surface thereof bonded to one surface of the substrate and another surface thereof bonded to one surface of the adhesive layer.

13. An image display device constituted of an optical-scanning-type image display device, the image display device including an optical scanning device and capable of forming an image by scanning an optical flux corresponding to a video signal and displaying the image by projection, wherein
    the optical scanning device includes an oscillating element which comprises:
    a substrate which is configured to support an oscillation portion in an oscillating manner;
    a driving layer which is configured to oscillate the oscillation portion, the driving layer including an adhesive layer formed on a substrate side thereof; and
    an intermediate layer which is positioned between the substrate and the driving layer, the intermediate layer having one surface thereof bonded to one surface of the substrate and another surface thereof bonded to one surface of the adhesive layer.

14. An image display device according to claim 13, wherein the image display device is a retinal-scanning-type image display device which displays the image on a retina of an eye by projection.

15. An image display device according to claim 13, wherein the image display device is a head-mounting-type image display device which is mounted on a head of a viewer.

16. A manufacturing method of an oscillating element which includes a substrate which is configured to support an oscillation portion in an oscillating manner, and a driving layer which is configured to oscillate the oscillation portion, the driving layer including an adhesive layer formed on a substrate side thereof, the manufacturing method comprising the steps of:
    forming an intermediate layer such that one surface of the intermediate layer is bonded to one surface of the substrate, and
    forming the adhesive layer such that one surface of the adhesive layer is bonded to another surface of the intermediate layer thus forming the intermediate layer between the substrate and the driving layer.

17. A manufacturing method of an oscillating element according to claim 16, further including a step of forming a piezoelectric element on another surface of the adhesive layer.

18. A manufacturing method of an oscillating element according to claim 16, further including a step of forming a piezoelectric element constituted of the adhesive layer and a piezoelectric layer by forming the piezoelectric layer on another surface of the adhesive layer.

19. A manufacturing method of an oscillating element according to claim 16, further including a step of making the surface roughness of another surface of the intermediate layer coarser than the surface roughness of one surface of the substrate.

20. A manufacturing method of an oscillating element according to claim 19, wherein the intermediate layer includes a metal layer, and the step of making the surface roughness of another surface of the intermediate layer coarser than the surface roughness of one surface of the substrate is performed by heat treatment after the metal film is formed.

21. A manufacturing method of an oscillating element according to claim 16, wherein the step of forming the intermediate layer is performed by stacking plural kinds of metal layers which differ from each other.

22. A manufacturing method of an oscillating element according to claim 16, wherein the step of forming the intermediate layer includes a film forming method selected from a group consisting of a vapor deposition method, a sputtering method, a sol-gel method, and a screen printing method.

* * * * *